United States Patent

Kobayashi

[15] 3,681,668

[45] Aug. 1, 1972

[54] SEMICONDUCTOR DEVICE AND A METHOD OF MAKING THE SAME

[72] Inventor: Isamu Kobayashi, Kanagawa-ken, Japan

[73] Assignee: Sony Corporation, Tokyo, Japan

[22] Filed: Nov. 12, 1968

[21] Appl. No.: 774,702

[30] Foreign Application Priority Data

Nov. 14, 1967 Japan ..........................42/73155
Dec. 21, 1967 Japan ..........................42/82055

[52] U.S. Cl. ......317/235 R, 317/235 AT, 317/235 A, 317/235 E

[51] Int. Cl. ..........................................H01l 11/14

[58] Field of Search .........317/235 AT, 235 A, 235 E

[56] References Cited

UNITED STATES PATENTS

| | | | |
|---|---|---|---|
| 3,386,865 | 6/1968 | Doo | 148/175 |
| 3,404,450 | 10/1968 | Karcher | 29/577 |
| 3,335,342 | 8/1967 | Leistiko | 317/235 |
| 3,349,300 | 10/1967 | Koepp | 317/235 |
| 3,449,647 | 6/1969 | Scott | 317/235 |
| 3,475,661 | 10/1969 | Iwata | 317/234 |

OTHER PUBLICATIONS

D. Boss, et al., I.B.M. Technical Disclosure Bulletin, Vol. 10, No. 2, July 1967.

*Primary Examiner*—John W. Huckert
*Assistant Examiner*—Martin H. Edlow
*Attorney*—Hill, Sherman, Meroni, Gross & Simpson

[57] ABSTRACT

Semiconductor device of the field effect transistor type including a first semiconductor region of one conductivity type, a second semiconductor region abutting the first region and containing at least one polycrystalline region and one single crystal region, the polycrystalline region having a conductivity type opposite to that of the first semiconductor region thereby forming a PN junction therealong, and a third semiconductor region formed in the second semiconductor region.

4 Claims, 21 Drawing Figures

INVENTOR.

ISAMU KOBAYASHI

BY Hill, Sherman, Meroni, Gross & Simpson

ATTORNEYS

INVENTOR.

ISAMU KOBAYASHI

BY Hill, Sherman, Meroni, Gross & Simpson ATTORNEYS

SEMICONDUCTOR DEVICE AND A METHOD OF MAKING THE SAME

BACKGROUND OF THE INVENTION

1. Field of the Invention

This invention is in the field of semiconductor devices such as field effect transistors wherein at least the source and drain areas consist principally of polycrystalline regions having a low direct current resistance between them and possessing improved high frequency characteristics.

2. Description of the Prior Art

Attempts have been made heretofore to reduce the resistance of electrode regions of semiconductor devices. One such method involves increasing the impurity concentration of the electrode region so as to lower its specific resistivity. However, conventional diffusion methods require a heat treatment for a long duration for making the high impurity concentration region. The necessity for the prolonged high temperature treatment causes diffusion of other junctions in the device to result in a deterioration of the characteristics of the finished semiconductor device. In addition, the prior art systems encountered difficulty when it was attempted to simultaneously diffuse impurities to different depths in different areas of the device.

SUMMARY OF THE INVENTION

The present invention provides a semiconductor device having one or more electrode portions of low resistance, the low resistance portions being produced by diffusing an impurity into a polycrystalline region whereby the high diffusion velocity is achieved, and greater impurity concentrations are achieved. One of the improved features of the present invention is the fact that it is possible to simultaneously form a plurality of impurity regions of different depth in the semiconductor device.

In general, the process of manufacture of the semiconductor device of the present invention involves first providing a semiconductor region of a given conductivity type, then forming a second semiconductor region over the first region, the second semiconductor region containing at least one polycrystalline region and at least one single crystal region, then diffusing an impurity of the type present in the first semiconductor region into the polycrystalline region to thereby lower its specific resistivity and simultaneously thereafter forming in the single crystal region a region of the same conductivity type as that of the first semiconductor region, whereby the differences in diffusion velocity between the polycrystalline regions and the single crystal region provides impurity penetrations of different depths.

DESCRIPTION OF THE PREFERRED EMBODIMENTS

Figures 1A, 1B, 1C, 1D, 1E, 1F, 1G:
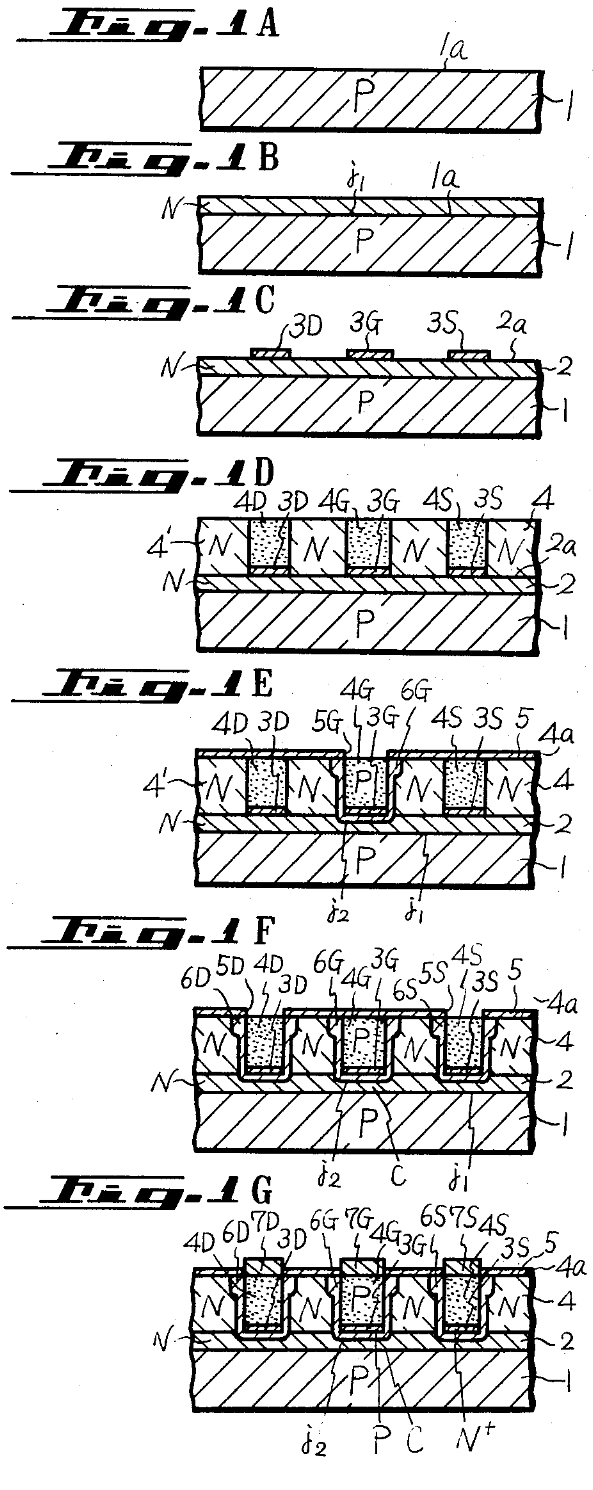
FIGS. 1A through 1G are greatly enlarged cross-sectional views showing the manner in which a junction field effect transistor can be manufactured according to the present invention.

In the sequence shown in FIGS. 1A through 1G, reference numeral 1 indicates generally a single crystal semiconductor substrate such, for example, as a single crystal silicon substrate of P-type conductivity. At least one surface 1*a* of the substrate 1 is provided with a mirror-like, clean finish 1*a* as illustrated in FIG. 1A.

The surface 1*a* of the silicon substrate 1 is then provided with an overlying single crystal semiconductor layer 2 of the opposite conductivity type, thereby forming a PN junction $j_1$ as shown in FIG. 1B. The deposition of single crystal layers, oxide films and techniques of impurity diffusion are all well known and established procedures in the semiconductor art and for that reason the temperatures, times and other processing variables are not specifically set forth in the specification, since they will be apparent to those having reasonable skill in the art and do not form specific features of the present invention.

The next step of the process consists in forming seeding sites or nuclei 3D, 3G and 3S in the upper surface 2*a* of the single crystal semiconductor 2 at those areas in which the drain, gate and source regions will be ultimately provided. The seeding sites or nuclei 3D, 3G and 3S may be formed of a material having a lattice constant different from that of the single crystal semiconductor layer 2, or they may be formed of noncrystalline material. The sites may be provided, for example, by selective deposition of materials such as sodium chloride, silicon, carbon, a silicon oxide, germanium or other metal on the surface of the layer 2*a* through a suitable mask by vapor deposition, cathode sputtering or the like. Another method for providing seeding sites is to alloy an impurity such as aluminum, indium, gallium, antimony, phosphorous, arsenic or the like along these selected areas. Still another technique for forming the seeding sites is to roughen or scratch the surface 2*a* of the single crystal semiconductor layer 2 at predetermined areas to thereby disturb the lattice in the layer 2.

The preferred seeding site consists of vapor deposited layers of polycrystalline silicon which do not have a masking effect toward subsequently diffused impurities.

The next step consists in depositing a semiconductor layer 4 of the same conductivity type as the layer 2 over the surface 2*a*. Alternatively, a high resistance semiconductor layer such as an intrinsic silicon layer can be deposited on the layer 2 by diffusion and growth techniques well known in the prior art. The resulting structure is shown in FIG. 1D. The semiconductor layer 4 consists of polycrystalline semiconductor portions 4D, 4G and 4S grown on the seeding sites 3D 3G and 3S and a single crystal semiconductor portion 4' grown directly on the surface 2*a* of the semiconductor layer in those portions in which no seeding sites were provided. Even in the case of a semiconductor layer 4 of an intrinsic semiconductor material, the N-type impurity of the underlying semiconductor layer 2 becomes diffused into the semiconductor layer 4 by the heating of the substrate incident to the deposition of the layer 4.

Subsequent to the formation of the semiconductor layer 4, an oxide layer 5 composed, for example, of a silicon oxide which has a masking effect toward impurities is deposited on the upper surface 4*a* of the semiconductor layer 4 by thermal decomposition, vapor deposition, or oxidation of the surface 4*a*. The silicon oxide layer 5 is selectively removed by photoetching or the like to form a window 5G overlying the polycrystalline semiconductor portion 4G, after which an impurity of the same conductivity type as the substrate 1, that is, a P-type impurity is diffused into the polycrystalline semiconductor portion 4G through the window 5G as illustrated in FIG. 1E. Since the impurity diffusion velocity in the polycrystalline portion is extremely high because of grain boundary diffusion, the impurity is diffused not only into the polycrystalline semiconductor portion 4G but also in the portions adjoining it, thus providing a P-type region 6G of high impurity concentration and low specific resistivity. In the case where the seeding site 3G underlying the polycrystalline semiconductor portion 4G is formed of a material as, for example, of non-crystalline silicon which has no masking effect on the impurity, the impurity is also diffused into the semiconductor layer 2. Even when the seeding site 3G is formed of a material such as a silicon oxide which has a masking effect toward impurity diffusion, the impurity is nevertheless diffused into the layer 2 around the seeding site, permitting the region 6G to extend into the semiconductor layer 2. The region 6G provides a PN junction $j_2$ with the semiconductor layer 2, and a channel C is formed in the semiconductor layer 2 between the junctions $j_1$ and $j_2$. Since the junction $j_2$ is formed in the single crystal semiconductor layer 2 and the single crystal portion 4′ of the semiconductor layer 4, the junction is very stable.

The next step in the process consists in filling in the window 5G by means of an oxide layer the same as the previously applied oxide layer 5. Then, the resulting continuous oxide layer 5 is selectively removed in the areas overlying the polycrystalline areas 4D and 4S by means of photoetching or the like to form windows 5D and 5S in those areas. An impurity of the same conductivity type as the semiconductor layers 2 and 4, an N-type impurity, is then diffused into the polycrystalline portions 4D and 4S through the windows 5D and 5S, thereby providing high impurity concentration and low specific resistivity regions 6D and 6S about the N-type polycrystalline semiconductor regions 4D and 4S. As in the previous impurity diffusion, the impurity diffuses through the polycrystalline portions 4D and 4S to reach the semiconductor layer 2 and consequently the regions 6D and 6S are electrically continuous to the N-type semiconductor layer 2.

Finally, the low specific resistivity regions 6D, 6G and 6S are provided with electrodes 7D, 7G and 7S in ohmic contact therewith, the electrodes serving as the drain, gate and source electrodes, respectively, thus providing a junction field effect transistor as shown in FIG. 1G. The electrodes 7D, 7G and 7S are shown as overlying the polycrystalline areas 4D, 4G and 4S, but they can be deposited over the adjoining high impurity concentration layers 6D, 6G and 6S which surround the polycrystalline semiconductor regions 4D, 4G and 4S.

In the junction field effect transistor shown in FIG. 1G, the low specific resistivity regions 6D and 6S extend down to the vicinity of the channel C in those portions in which the drain and source electrodes 7D and 7S are provided, so that the series resistances of the drain and source can be reduced to a low value. Since the gate region is formed of a high impurity concentration region 6G, the resistance of the gate region is also lowered. It has been found, for example, that the specific resistivity of the polycrystalline semiconductor portion can be decreased to about one-tenth of that of a single crystal semiconductor portion formed by diffusing an impurity under the same conditions. Thus, a junction field effect transistor of improved high frequency characteristics is produced.

In the foregoing example, the polycrystalline semiconductor portions 4D, 4G and 4S, and the high impurity concentration regions 6D, 6G and 6S are provided, respectively, in the drain, gate and source regions, but it will be understood that such a polycrystalline semiconductor portion which exhibits low specific resistance can be formed solely in the drain region or in the source region.

Since the impurity diffusion velocity in the single crystal portions is substantially lower than that in the polycrystalline portion, the impurity diffusion for the formation of the gate region is rapid down to the bottom of the polycrystalline portion 4G and then the diffusion becomes substantially slower. Consequently, the depth of the gate region and accordingly the thickness of the channel C can be adjusted precisely by controlling the depth of the portion 4G.

Figures 2A, 2B, 2C, 2D, 2E, 2F:
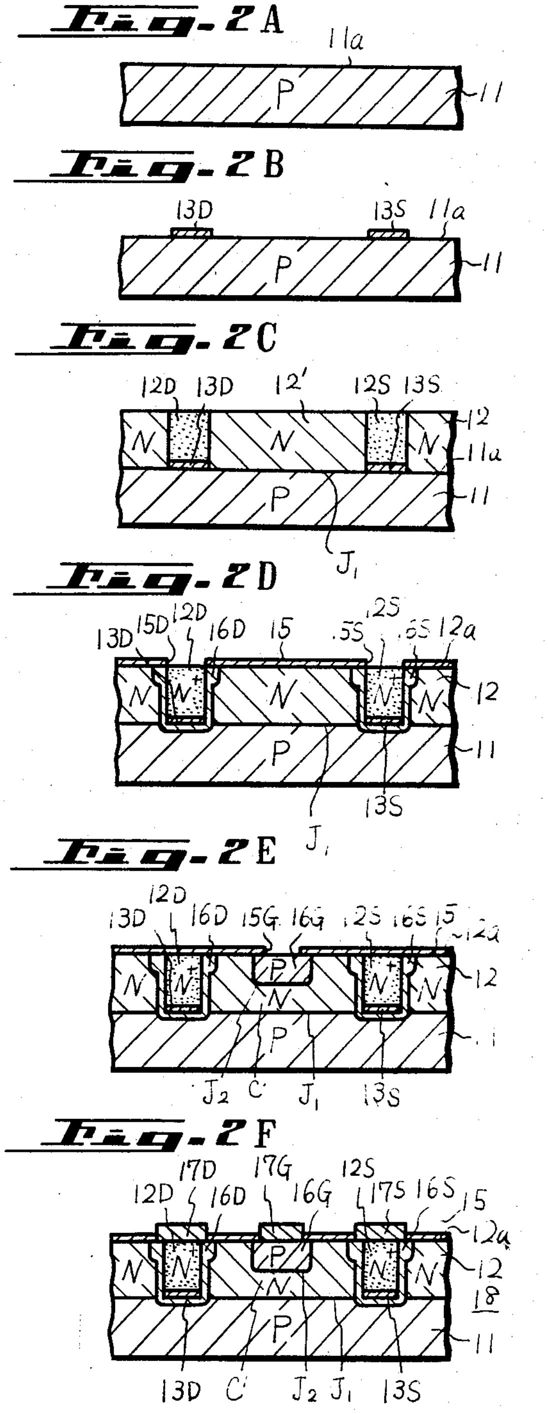
FIGS. 2A to 2F, inclusive, are greatly enlarged views in cross-section of a modified form of the invention shown in FIGS. 1A through 1G, inclusive.

The modified form of the invention shown in FIGS. 2A through 2F involves forming the gate portion by diffusion without the presence of the polycrystalline region in the gate area. The first step is to provide, for example, a P-type silicon single crystal substrate 11 with at least one surface 11a which is clean and mirror-like. Then, seeding sites or nuclei 13D and 13S of the type previously described are formed in the surface 11a of the substrate 11 in those areas where the drain and source regions of the finished junction field effect transistor will be provided, as shown in FIG. 2B. Then, an N-type semiconductor such as a silicon layer 12 is deposited by vapor growth techniques on the surface 11*a*, thereby providing a PN junction $J_1$ as illustrated in FIG. 2C. During the growth process, the silicon layer 12 deposited thereon contains polycrystalline semiconductor portions 12D and 12S grown on the seeding sites 13D and 13S and a single crystal semiconductor portion 12′ directly grown on the surface 11*a* between the drain and source portions. Subsequently, the surface 12*a* of the silicon layer 12 is coated with a masking layer 15 composed of a silicon oxide or the like, and the layer 15 is selectively removed by photoetching or the like to form windows 15D and 15S overlying the polycrystalline semiconductor portions 12D and 12S. Then, an impurity of the same conductivity type as that of the silicon layer 12, that is, an N-type impurity is diffused into the polycrystalline semiconductor portions 12D and 12S through the windows 15D and 15S thereby forming N-type high impurity concentration layers 16D and 16S about the polycrystalline semiconductor portions 12D and 12S.

The next step consists in closing the windows 15D and 15S by means of oxidation or the like and then forming a window 15G overlying the area in which the gate region is to be provided. An impurity of the same conductivity type as that of the substrate 11, that is, a P-type impurity is diffused into the silicon layer 12 through the window 15G to form a P-type region 16G which serves as the gate portion. Thus, a channel C′ is provided between the junction $J_1$ and a junction $J_2$ formed between the gate region 16G and the silicon layer 12.

After the provision of the gate region 16G, drain, gate and source electrodes 17D, 17G and 17S are formed on the drain, gate and source regions 16D, 16G and 16S to provide a junction field effect transistor generally indicated at reference numeral 18 in FIG. 2F. In this case, it is also preferred that the high impurity concentration and low specific resistivity regions 16D and 16S include the polycrystalline semiconductor portions 12D and 12S and their surrounding high impurity concentration portions, and that the electrodes 17D and 17S be formed over the entire area including the exposed surfaces of the polycrystalline portions 12D and 12S and their surrounding portions.

A junction field effect transistor 18 has the same advantages as that previously described in that the series resistances of the drain and source can be reduced because of the presence of the high impurity concentration regions 16D and 16G in those portions in which the drain and gate regions are provided.

Although the foregoing examples have described an N-channel junction field effect transistor, the same results can obviously be obtained by employing a P-channel field effect transistor.

FIGS. 3A through 3E illustrate another example of the invention, as best applied to a novel field effect transistor having remote cutoff characteristics.

Figure 3A:
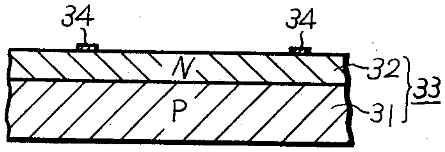
FIGS 3A through 3D are greatly enlarged cross-sectional views of the successive steps involved in producing a remote cutoff field effect transistor in accordance with the present invention.
Figure 3B:
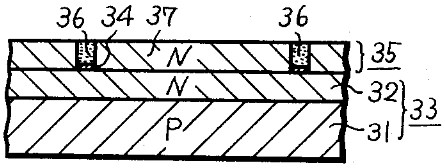

A P-type silicon semiconductor substrate 31 is first formed with an N-type silicon layer 32 by any of the usual processes. Alternatively, instead of depositing the N-type layer 32 over the surface of the substrate 31, the N-type layer can be formed beneath the surface of the P-type layer 31 by diffusing an impurity therein. A plurality of seeding sites 34 composed, for example, of silicon are vapor deposited on the resulting substrate 33 consisting of the combination of the substrate 31 and the layer 32 as shown in FIG. 3A.

Figure 3C:
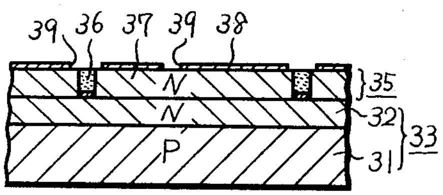
Figure 3D:
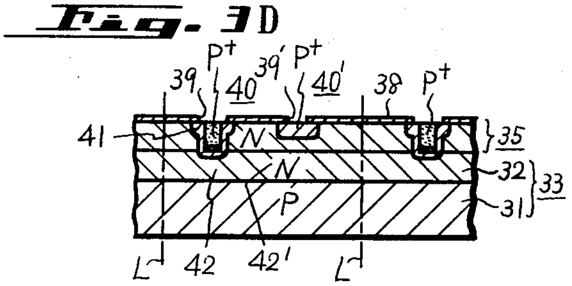

Next, an N-type layer 35 is grown on the entire surface of the semiconductor substrate 33 to provide a polycrystalline growth layer 36 and a single crystal growth layer 37. The growth layer 35 is then coated with a silicon oxide film 38 which is selectively removed to form windows 39 and 39′ as shown in FIG. 3C. A P-type impurity is then diffused through the windows 39 and 39′ to provide gate regions 40 and 40′ of high impurity concentration as shown in FIG. 3D.

Figure 3E:
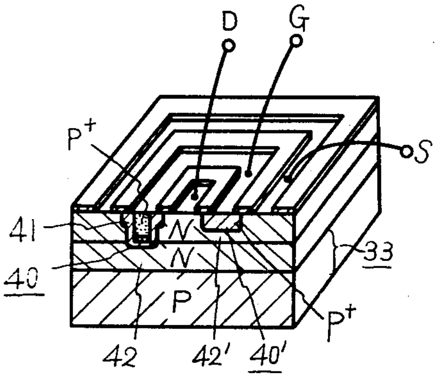
FIG. 3E is a view in perspective of a device produced by the sequence shown in FIGS. 3A through 3D, inclusive.

FIG. 3E illustrates the completed device in perspective. As apparent from this figure, the transistor is formed by severing the substrate along the section lines L shown in FIG. 3D. The gate regions 40 and 40′ electrically surround the drain D and the source S is isolated from the drain D by channels 42 and 42′ of different depths. Consequently, the cutoff voltage of the channel 42 is relatively large while that of channel 42′ is relatively small, and the cutoff characteristics of the element are a combination of the two, so that the element exhibits gradual cutoff characteristics, usually referred to as remote cutoff characteristics.

As previously explained, junctions of different diffusion depths can be achieved in a short time, and the conductivity of the portion extending from the surface of the element down to the junction formed deep in the semiconductor region is very high. Consequently, the remote cutoff type field effect transistor is particularly useful at high frequencies because of the low resistance of the gate regions. In addition, the deep gate region can be formed by diffusion in a short time so that the P-type impurity is not substantially diffused from the P-type semiconductor substrate into the N-type growth layer defining the width of the channel, thereby insuring uniformity in the transistor characteristics.

Figure 4A:
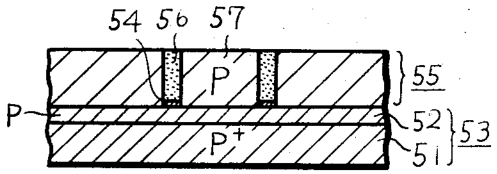
FIGS. 4A through 4C are greatly enlarged cross-sectional views of a sequence of steps employed in the manufacture of a graft base transistor in accordance with the present invention.
Figure 4B:
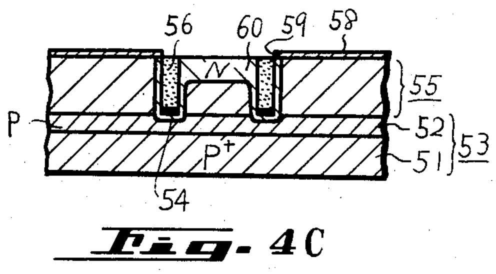
Figure 4C:
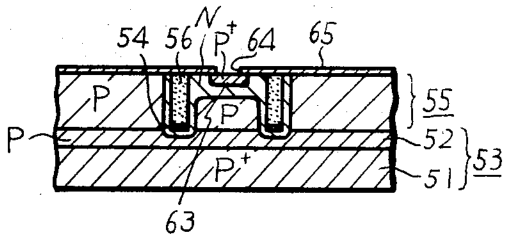

The embodiment of FIGS. 4A through 4C illustrates the application of the invention in the manufacture of a graft base transistor. A P-type silicon growth layer 52 is first deposited on a P-type high impurity silicon slice 51 to form the collector region and provide a semiconductor substrate 53 on which a seeding site 54 is formed in an annular shape. In this case, it is desirable that the seeding site 54 be formed of a material such, for example, as silicon oxide which serves as an impurity diffusion mask. Thereafter, a P-type growth layer 55 is deposited on the entire surface of the semiconductor substrate 53 including the seeding site 54 as shown in FIG. 4A, the growth layer 55 consisting of an annular polycrystalline growth layer 56 and a single crystal growth layer 57. After this, a silicon oxide film 58 is deposited on the growth layer 55 and is selectively removed to form a window 59 surrounding the annular polycrystalline growth layer 56, the periphery of the window being aligned with the periphery of the polycrystalline growth layer 56. An N-type impurity is diffused through the window 59 to form a base region 60 as shown in FIG. 4B. Since the impurity diffuses into the polycrystalline growth layer 56 at a high velocity, the impurity concentration of the layer 56 becomes very high and its conductivity is accordingly high. An oxide film 65 is then provided over the surface and is selectively removed to form a window 64 through which a P-type impurity is diffused to form an emitter region 63 as illustrated in FIG. 4C. The impurity concentration in the polycrystalline growth layer 56 becomes very high in a short time so that the impurity in the semiconductor substrate 53 is not likely to become diffused into the growth layer 55 in the formation of the base and emitter regions 60 and 63, thereby resulting in a great increase of the voltage which the collection junction can withstand.

It should be understood that while the process of the present invention can be applied to various other types of semiconductor devices, for example, diodes, without departing from the scope of the novel concepts of this invention.

I claim as my invention:

1. A field effect transistor comprising a semiconductor substrate of monocrystalline material of one conductivity type, having one or more epitaxial layers thereon all of a conductivity type opposite to that of said substrate, the uppermost of said epitaxial layers including a gate region therein of the same conductivity type as said substrate extending at least partially therethrough, said uppermost layer also including low resistivity polycrystalline regions of the same conductivity type as said first epitaxial layer on opposite sides of said gate region extending from the outer surface of the uppermost layer to a point in close proximity to the layer lying immediately therebelow, said polycrystalline regions being of substantially constant low resistivity throughout and serving as drain and source electrodes.

2. A field effect transistor comprising a substrate of one conductivity type and at least two epitaxial layers of the opposite conductivity type thereon of monocrystalline semiconductor material, the upper of said epitaxial layers having at least three low resistivity polycrystalline regions therein spaced substantially in a line, the middle one of said polycrystalline regions being of the same conductivity type as said substrate and the other two polycrystalline regions being of opposite conductivity type as that of said substrate, each of said polycrystalline regions extending from the outer surface of the upper of said layers to an area substantially in proximity to the upper surface of the lower of said layers, the upper outer ends of said polycrystalline regions being provided respectively with drain, gate and source electrodes on the exposed surface of said upper epitaxial layer, and the lower of said epitaxial layers providing a channel between said source and drain electrodes, said polycrystalline regions being of substantially constant low resistivity throughout.

3. A field effect transistor comprising a monocrystalline substrate of one conductivity type, an epitaxial monocrystalline layer thereon of the opposite conductivity type, said epitaxial layer having a gate region extending from the surface thereof to a point interior of said layer and spaced upwardly from said substrate, said gate region being of the same conductivity type as said substrate, said layer having two low resistivity polycrystalline regions on opposite sides of and spaced from said gate region to substantially the surface of said substrate, said two polycrystalline regions being of substantially constant low resistivity throughout and serving as drain and source electrodes.

4. A remote cut-off field effect transistor comprising a monocrystalline substrate of one conductivity type, an epitaxial monocrystalline layer of the opposite conductivity type thereon and forming a junction with said substrate, a second epitaxial monocrystalline layer on said first layer having islands portions of polycrystalline semiconductor material thereon, said second layer forming a junction with said first layer, said polycrystalline portion of said second layer extending from the upper surface thereof to substantially the junction between said first and second layers and forming below its lower end or first channel, said polycrystalline portion of said second layer being doped with the same impurity type as said substrate, an isolated portion of said monocrystalline portion being doped with an impurity type the same as that of said substrate from the upper surface of said second layer to a region part way down to said first layer and forming below its lower end a second channel, said last mentioned polycrystalline portion and said isolated portion constituting gate electrode means, the portion of said second layer lying between said polycrystalline portion and said isolated portion constituting drain electrode means, and the portion of said second layer lying peripherally outside said polycrystalline portion and said isolated portion constituting source electrode means.

* * * * *